US007806576B2

(12) United States Patent
Yoshida et al.

(10) Patent No.: US 7,806,576 B2
(45) Date of Patent: Oct. 5, 2010

(54) IMAGE GENERATING APPARATUS

(75) Inventors: Yuichi Yoshida, Daito (JP); Satoshi Nakano, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 363 days.

(21) Appl. No.: 11/958,932

(22) Filed: Dec. 18, 2007

(65) Prior Publication Data

US 2008/0144321 A1 Jun. 19, 2008

(30) Foreign Application Priority Data

Dec. 18, 2006 (JP) ............................ 2006-339961

(51) Int. Cl.
*H01L 33/00* (2010.01)

(52) U.S. Cl. ..................... 362/555; 362/85; 362/249.05

(58) Field of Classification Search ................. 362/555, 362/558, 85, 249.02, 249.05, 333; 345/170; 200/314; 358/475
See application file for complete search history.

(56) References Cited

U.S. PATENT DOCUMENTS 4,583,151 A * 4/1986 Nagel .......................... 362/29
5,432,684 A * 7/1995 Fye et al. ....................... 362/30
6,439,151 B1 * 8/2002 Bowers et al. ............. 116/28.1
6,612,725 B2 * 9/2003 Camarota et al. ........... 362/372
7,459,648 B2 * 12/2008 Asai ........................... 200/310

FOREIGN PATENT DOCUMENTS

| | | | |
|---|---|---|---|
| JP | 5-41134 | A | 2/1993 |
| JP | 5-307922 | A | 11/1993 |
| JP | 9-282972 | A | 10/1997 |
| JP | 2002-260479 | A | 9/2002 |
| JP | 2005-084460 | A | 3/2005 |

* cited by examiner

*Primary Examiner*—Stephen F. Husar
*Assistant Examiner*—Peggy A. Neils
(74) *Attorney, Agent, or Firm*—Crowell & Moring LLP

(57) ABSTRACT

An image generating apparatus includes an light guide member so arranged as to surround the light-emitting device, wherein a circumferential light-emitting surface of the light guide member is so arranged as to be inclined with respect to a surface on which the light-emitting device is set and a circumferential light guide portion of the light guide member is formed such that a vertical thickness is substantially uniform with respect to the surface on which the light-emitting device is set.

15 Claims, 9 Drawing Sheets

IMAGE GENERATING APPARATUS

BACKGROUND OF THE INVENTION

1. Field of the Invention

The present invention relates to an image generating apparatus, and more particularly, it relates to an image generating apparatus comprising a light-emitting device emitting light for display.

2. Description of the Background Art

A switch or a button having a light-emitting device emitting light for display is known in general, as disclosed in Japanese Patent Laying-Open Nos. 09-282972 (1997), 05-307922 (1993), 2002-260479, 2005-84460 or 05-41134 (1993) for example. An image generating apparatus including such a switch or a button is known.

The aforementioned Japanese Patent Laying-Open No. 09-282972 discloses a push-button with an operational display having a structure in which a light-emitting device is set at the back of a center of a pressing surface as a light-emitting surface and the light-emitting surface and a set surface of the light-emitting device are arranged substantially parallel to each other, and capable of uniformly brightening the pressing surface (light-emitting surface) due to a uniform thickness of a light guide portion.

The aforementioned Japanese Patent Laying-Open No. 05-307922 discloses a lighting push-button switch in which a light-emitting diode (light-emitting device) is set below a center of a push-button switch top surface as a light-emitting surface and the push-button switch top surface and a set surface of the light-emitting diode are arranged substantially parallel to each other.

The aforementioned Japanese Patent Laying-Open No. 2002-260479 discloses a switch apparatus with a light in which a light source (light-emitting device) is set below a center of a holding sheet (light-emitting surface) and the holding sheet and a set surface of the light source are substantially parallel to each other.

The aforementioned Japanese Patent Laying-Open No. 2005-84460 discloses a button switch or the like having a structure in which a luminous body (light-emitting device) is set below a center of the light-emitting surface and the light-emitting surface and a set surface of the luminous body are arranged substantially parallel to each other, and capable of uniformly brightening the light-emitting surface due to diffusion of guided light by employing a light diffusing material in a light guide portion.

The aforementioned Japanese Patent Laying-Open No. 05-41134 discloses a lighting button apparatus having a structure in which a light-emitting diode (light-emitting device) is set below a center of a lighting portion (light-emitting surface) and the lighting portion and a set surface of the light-emitting diode are arranged substantially parallel to each other, and capable of diffusing incident light and uniformly brightening the lighting portion due to a Fresnel prism (prism having a saw-toothed section) provided on a rear surface (light incident surface) of the lighting portion.

In all sorts of the switches or the buttons described in the aforementioned Japanese Patent Laying-Open Nos. 09-282972, 05-307922, 2002-260479, 2005-84460 and 05-41134, however, the light-emitting surface and the set surface of the light-emitting device are arranged substantially parallel to each other, and hence it is disadvantageously difficult that the light-emitting surface is uniformly brightened in a structure in which the light-emitting surface is so arranged as to be inclined with respect to the set surface of the light-emitting device. Therefore, also when such a switch or button is employed in an image generating apparatus having a structure in which the light-emitting surface of the switch or the button is so arranged as to be inclined with respect to the set surface of the light-emitting device, it is disadvantageously difficult that the light-emitting surface such as the switch of the image generating apparatus is uniformly brightened.

SUMMARY OF THE INVENTION

The present invention has been proposed in order to solve the aforementioned problem, and an object of the present invention is to provide an image generating apparatus having a structure in which a light-emitting surface is so arranged as to be inclined with respect to a set surface of a light-emitting device, capable of uniformly brightening the light-emitting surface.

An image generating apparatus according to a first aspect of the present invention comprises a light-emitting device emitting light for display, and a light guide member so arranged as to surround the light-emitting device and including a circumferential light-emitting surface and a circumferential light guide portion guiding the light emitted from the light-emitting device to the light-emitting surface, wherein the circumferential light-emitting surface is so arranged as to be inclined with respect to a surface on which the light-emitting device is set, and the circumferential light guide portion is formed such that a vertical thickness is substantially uniform with respect to the surface on which the light-emitting device is set.

In the image generating apparatus according to the first aspect, as hereinabove described, the circumferential light-emitting surface is so arranged as to be inclined with respect to the surface on which the light-emitting device is set, and the circumferential light guide portion is formed such that the vertical thickness is substantially uniform with respect to the surface on which the light-emitting device is set, whereby the light emitted from the light-emitting device can be guided to the light-emitting surface through the light guide portion having the uniform thickness and hence the light-emitting surface can be uniformly brightened also when the circumferential light-emitting surface is so arranged as to be inclined with respect to the set surface of the light-emitting device.

In the aforementioned image generating apparatus according to the first aspect, the light-emitting surface is preferably constituted by a first surface of the circumferential light guide portion, and the light guide portion is preferably formed such that the first surface constituting the light-emitting surface and a second surface on a side opposite to the first surface are substantially parallel to each other. According to this structure, the circumferential light guide portion can be easily formed such that the vertical thickness is substantially uniform with respect to the surface on which the light-emitting device is set.

In the aforementioned image generating apparatus according to the first aspect, at least the light-emitting surface of the light guide member preferably has a finely corrugated shape diffusing light. According to this structure, diffused light can be emitted on the light-emitting surface and hence the light-emitting surface can be uniformly brightened.

In this case, the light-emitting surface is preferably constituted by a first surface of the circumferential light guide portion, and an outer peripheral side surface of the circumferential light guide portion of the light guide member and a second surface on a side opposite to the first surface constituting the light-emitting surface each preferably have the finely corrugated shape diffusing light. According to this structure, diffused light inside the light guide portion can be reflected on the outer peripheral side surface of the light guide portion and the second surface on the side opposite to the light-emitting surface, and hence the diffused light can be guided to the light-emitting surface. Consequently, the light-emitting surface can be further uniformly brightened.

In the aforementioned structure in which the light-emitting surface of the light guide member has the finely corrugated shape, at least an inner peripheral side surface of the circumferential light guide portion of the light guide member, upon which the light emitted from the light-emitting device is incident preferably has a flat surface shape without the finely corrugated shape diffusing light. According to this structure, light having reached the inner peripheral side surface of the light guide portion from the light-emitting device is not diffused and hence as much light as possible can be incident inside the light guide portion. Consequently, the light-emitting surface can be further brightened.

In the aforementioned image generating apparatus according to the first aspect, the light guide member preferably includes a dome portion having a light guide function, so provided inside the circumferential light guide portion as to be continuous to the light guide portion and cover the light-emitting device. According to this structure, the light guide member can guide light incident upon the dome portion from the light-emitting device to the light-emitting surface and hence the light-emitting surface can be further brightened.

In this case, the image generating apparatus preferably further comprises an infrared communication receiving portion provided in the vicinity of the light-emitting device for display, an infrared filter member so arranged as to cover the dome portion and having a filtering function capable of transmitting infrared ray while blocking visible light, and a reflective layer for reflecting the light from the light-emitting device, provided on a surface of the dome portion or a surface of the infrared filter member located between the dome portion and the infrared filter member. According to this structure, the reflective layer can inhibit light incident upon the dome portion from the light-emitting device from transmitting through the dome portion, and hence a larger amount of the light incident upon the dome portion can be guided to the light-emitting surface. Thus, the light-emitting surface can be further brightened.

In the aforementioned structure comprising the infrared communication receiving portion, the dome portion of the light guide member preferably has an opening for transmitting the infrared ray at a position opposed to the infrared communication receiving portion. According to this structure, an infrared signal can pass through the opening without blocking the same due to the light guide member and hence the infrared signal can reach the infrared communication receiving portion.

The aforementioned image generating apparatus according to the first aspect preferably further comprises a support portion movably supporting the light guide member in a pressing direction, and a switch portion arranged in the vicinity of the light-emitting device, wherein the light guide member preferably further includes a switch pressing portion arranged at a position opposed to the switch portion. According to this structure, the switch pressing portion can be pressed against the switch portion by pressing the light guide member and hence the light guide member can function as a press button.

In this case, the support portion preferably includes an arm portion so deflected as to be moved in a direction in which the switch pressing portion of the light guide member presses the switch portion by pressing the light guide member, and the switch pressing portion is preferably so formed as to be moved in a direction for separating from the switch portion with restoring force of deflected the arm portion when press to the light guide member is released. According to this structure, the switch pressing portion can be easily pressed against the switch portion and the switch pressing portion can be easily separated from the switch portion when the press is released.

An image generating apparatus according to a second aspect of the present invention comprises a light-emitting device emitting light for display, a light guide member so arranged as to surround the light-emitting device and including a circumferential light-emitting surface and a circumferential light guide portion guiding the light emitted from the light-emitting device to the light-emitting surface, a support portion movably supporting the light guide member in a pressing direction, a switch portion arranged in the vicinity of the light-emitting device, an infrared communication receiving portion provided in the vicinity of the light-emitting device for display, an infrared filter member having a filtering function capable of transmitting infrared ray while blocking visible light, and a reflective layer for reflecting the light from the light-emitting device, wherein the light guide member further includes a dome portion having a light guide function and a switch pressing portion arranged at a position opposed to the switch portion, the circumferential light-emitting surface is so arranged as to be inclined with respect to a surface on which the light-emitting device is set, and constituted by a first surface of the circumferential light guide portion, the circumferential light guide portion is formed such that a vertical thickness is substantially uniform with respect to the surface on which the light-emitting device is set and the first surface constituting the light-emitting surface and a second surface on a side opposite to the first surface are substantially parallel to each other, the dome portion is so provided inside the circumferential light guide portion as to be continuous to the light guide portion and cover the light-emitting device, the infrared filter member is so arranged as to cover the dome portion, and the reflective layer is provided on a surface of the dome portion or a surface of the infrared filter member located between the dome portion and the infrared filter member.

In the image generating apparatus according to the second aspect, as hereinabove described, the circumferential light-emitting surface is so arranged as to be inclined with respect to the surface on which the light-emitting device is set, and the circumferential light guide portion is formed such that the vertical thickness is substantially uniform with respect to the surface on which the light-emitting device is set, whereby the light emitted from the light-emitting device can be guided to the light-emitting surface through the light guide portion having the uniform thickness and hence the light-emitting surface can be uniformly brightened also when the circumferential light-emitting surface is so arranged as to be inclined with respect to the set surface of the light-emitting device. The circumferential light-emitting surface is constituted by the first surface of the circumferential light guide portion, and the light guide portion is formed such that the first surface constituting the light-emitting surface and the second surface on the side opposite to the first surface are substantially parallel to each other, whereby the circumferential light guide portion can be easily formed such that the vertical thickness is substantially uniform with respect to the surface on which the light-emitting device is set. The light guide member further includes the dome portion having the light guide function, so provided as to be continuous to the circumferential light guide portion and cover the light-emitting device, whereby light incident upon the dome portion from the light-emitting device can be guided to the light-emitting surface and hence the light-emitting surface can be further brightened. The image generating apparatus further comprises the reflective layer for reflecting the light from the light-emitting device, provided on the surface of the dome portion or the surface of the infrared filter member located between the dome portion and the infrared filter member so arranged as to cover the dome portion, whereby the reflective layer can inhibit light incident upon the dome portion from the light-emitting device from transmitting through the dome portion, and hence a larger amount of the light incident upon the dome portion can be guided to the light-emitting surface. Thus, the light-emitting emitting surface can be further brightened. The image generating apparatus further comprises the support portion movably supporting the light guide member in the pressing direction, and the switch portion arranged in the vicinity of the light-emitting device, wherein the light guide member includes the switch pressing portion arranged at the position opposed to the switch portion, whereby the switch pressing portion can be pressed against the switch portion by pressing the light guide member and hence the light guide member can function as a press button.

In the aforementioned image generating apparatus according to the second aspect, at least the light-emitting surface of the light guide member preferably has a finely corrugated shape diffusing light. According to this structure, diffused light can be emitted on the light-emitting surface and hence the light-emitting surface can be uniformly brightened.

In this case, the light-emitting surface is constituted by the first surface of the circumferential light guide portion, and an outer peripheral side surface of the circumferential light guide portion of the light guide member and a second surface on a side opposite to the first surface constituting the light-emitting surface each preferably have the finely corrugated shape diffusing light. According to this structure, diffused light inside the light guide portion can be reflected on the outer peripheral side surface of the light guide portion and the second surface on the side opposite to the light-emitting surface, and hence the diffused light can be guided to the light-emitting surface. Consequently, the light-emitting surface can be further uniformly brightened.

In the aforementioned structure in which the light-emitting surface of the light guide member has the finely corrugated shape, at least an inner peripheral side surface of the circumferential light guide portion of the light guide member, upon which the light emitted from the light-emitting device is incident preferably has a flat surface shape without the finely corrugated shape diffusing light. According to this structure, light having reached the inner peripheral side surface of the light guide portion from the light-emitting device is not diffused and hence as much light as possible can be incident inside the light guide portion. Consequently, the light-emitting surface can be further brightened.

In the aforementioned image generating apparatus according to the second aspect, the dome portion of the light guide member preferably has an opening for transmitting the infrared ray at a position opposed to the infrared communication receiving portion. According to this structure, an infrared signal can pass through the opening without blocking the same due to the light guide member and hence the infrared signal can reach the infrared communication receiving portion.

In the aforementioned image generating apparatus according to the second aspect, the support portion preferably includes an arm portion so deflected as to be moved in a direction in which the switch pressing portion of the light guide member presses the switch portion by pressing the light guide member, and the switch pressing portion is preferably so formed as to be moved in a direction for separating from the switch portion with restoring force of deflected the arm portion when press to the light guide member is released. According to this structure, the switch pressing portion can be easily pressed against the switch portion and the switch pressing portion can be easily separated from the switch portion when the press is released.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be hereinafter described with reference to the drawings.

A structure of a dye sublimation printer according to the embodiment of the present invention will be now described with reference to FIGS. 1 to 14. This embodiment of the present invention is applied to the dye sublimation printer, which is an exemplary image generating apparatus.

Figure 1:
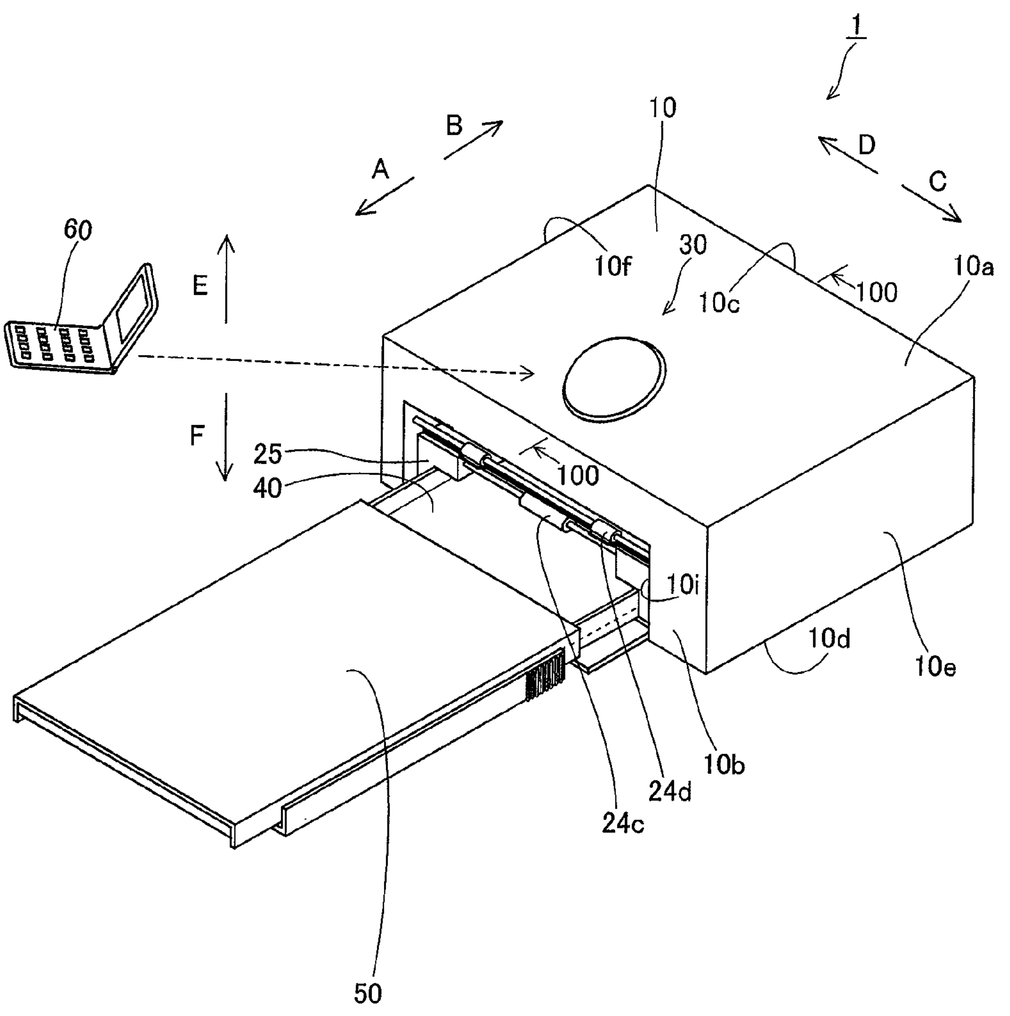
FIG. 1 is a perspective view showing an overall structure of a dye sublimation printer according to an embodiment of the present invention.
Figure 2:
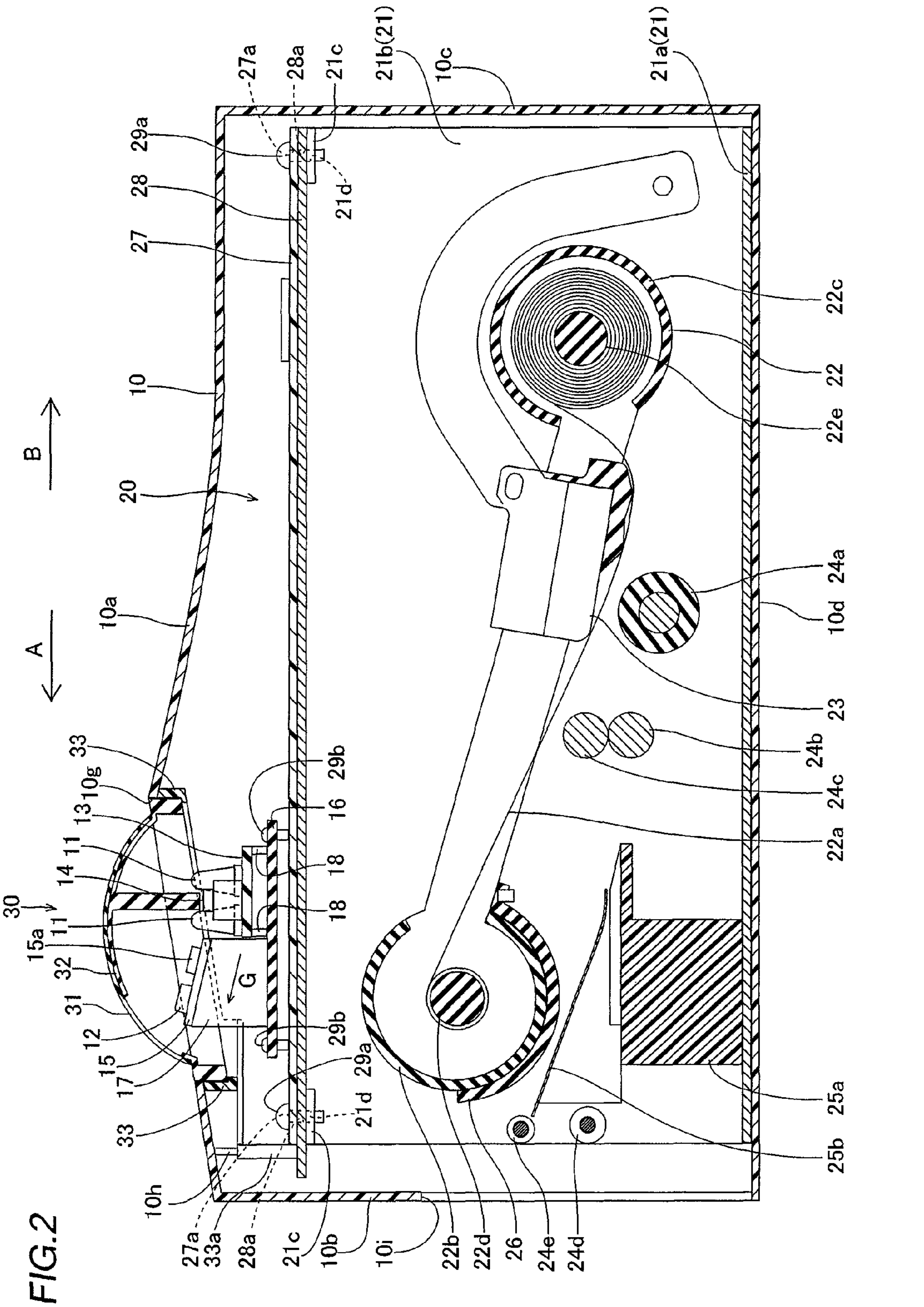
FIG. 2 is a sectional view taken along the line 100-100 in FIG. 1.

The dye sublimation printer 1 according to this embodiment comprises a housing 10, a printing portion 20 (see FIG. 2) stored in the housing 10, a power button 30 arranged on a housing upper surface 10*a*, as shown in FIGS. 1 and 2. A paper cassette 50 storing a paper 40 is detachably mounted on a housing front surface 10*b* along arrow A of the housing 10. According to this embodiment, a portable telephone 60 having a camera function is supposed as an apparatus capable of infrared communication with the dye sublimation printer 1, as shown in FIG. 1.

As shown in FIGS. 1 and 2, the housing 10 is constituted by a housing rear surface 10*c* along arrow B, a housing lower surface 10*d*, a housing side surface 10*e* (see FIG. 1) along arrow C and a housing side surface 10*f* (see FIG. 1) along arrow D in addition to the aforementioned housing upper surface 10*a* and housing front surface 10*b* along arrow A. As shown in FIG. 2, the housing upper surface 10*a* is so formed as to be inclined with respect to a horizontal plane and has an opening 10*g* for mounting the power button 30 on an inclined surface. Protrusions (bosses) 10*h* for mounting the power button 30 on an inner surface in front of (along arrow A) the opening 10*g* are integrally provided on the housing upper surface 10*a*. A paper cassette receiving opening 10*i* for mounting the paper cassette 50 (see FIG. 1) is provided on the housing front surface 10*b*.

Figure 3:
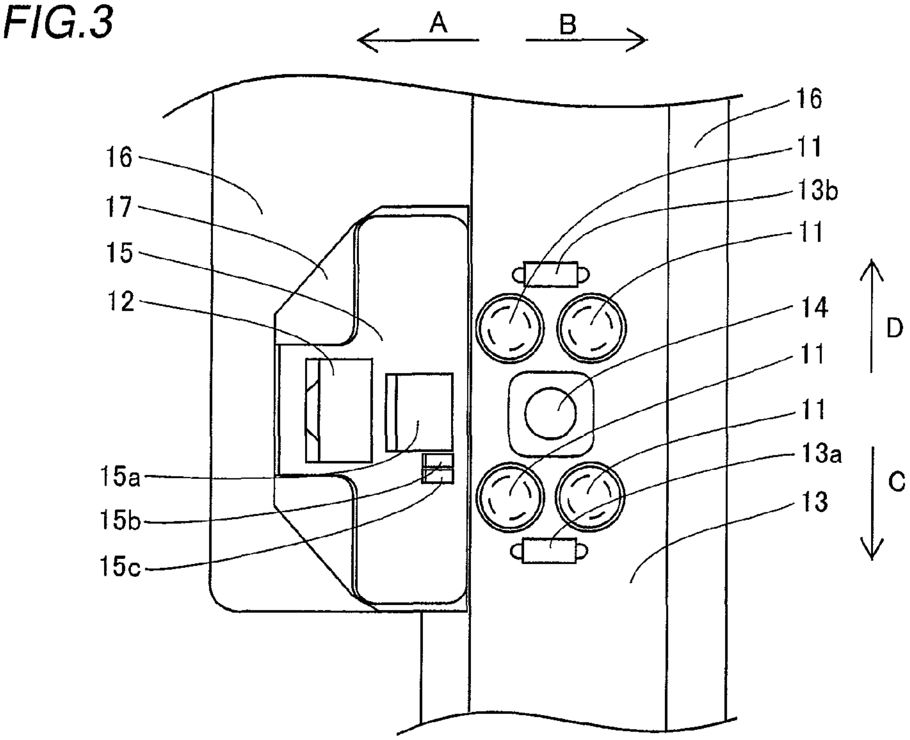
FIG. 3 is a plan view showing the vicinity of display LEDs of the dye sublimation printer according to the embodiment of the present invention shown in FIG. 1.
Figure 4:
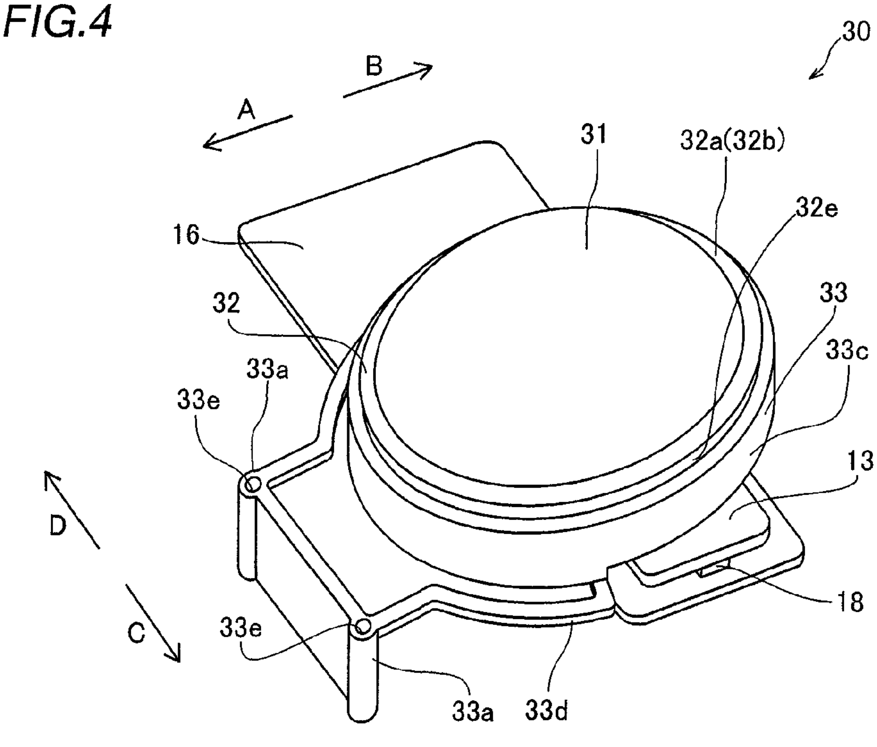
FIG. 4 is a perspective view showing the vicinity of a power button of the dye sublimation printer according to the embodiment of the present invention shown in FIG. 1.

Four display LEDs 11 emitting light for display and an infrared receiving portion 12 capable of receiving an infrared signal from the portable telephone 60 (see FIG. 1) in the range of about 30° (about ±15°) are arranged above the printing portion 20 in the housing 10. The display LED 11 is an example of the "light-emitting device" in the present invention. The four display LEDs 11 are arranged on a board 13 horizontally set, as shown in FIGS. 2 and 3. A switch portion 14 is arranged at a position surrounded by the four display LEDs 11 on the board 13 and electronic components 13*a* and 13*b* are arranged on sides along arrows C and D of the four display LEDs 11 respectively. As shown in FIG. 2, the infrared receiving portion 12 is arranged on a base plate 15 set in an upward direction at an angle of about 15° with respect to a horizontal direction (along arrow G). Thus, the infrared receiving portion 12 capable of receiving the infrared signal in the range of about 30° (about ±15°) is capable of receiving the infrared signal in the range of about ±15° with respect to the upward direction at an angle of about 15° (range of about 30° upward from the horizontal plane) in a state where the housing 10 is horizontally set. Electronic components 15*a*, 15*b* and 15*c* are set at the back of the infrared receiving portion 12 (along arrow B) on the base plate 15. As shown in FIGS. 2 and 3, the base plate 15 is supported with a base plate pedestal 17 arranged on a base 16. The board 13 is set at the back of the base plate pedestal 17 (along arrow B) on an upper surface of the base 16 through leg portions 18 (see FIG. 2).

As shown in FIG. 2, the printing portion 20 has a bottom portion and side portions covered with a chassis 21 made of metal and is mountable with an ink sheet cartridge 22 storing an ink sheet 22*a*. The printing portion 20 includes a print head 23 for performing printing, a platen roller 24*a* so arranged as to be opposed to a print head 23, a feed roller 24*b* made of metal, a press roller 24*c* made of metal pressing the feed roller 24*b* with prescribed pressing force, a paper feed roller 24*d* made of rubber, a paper discharge roller 24*e* made of rubber, a lower paper guide 25*a* made of resin, an upper paper guide 25*b* made of resin, an ink sheet cartridge support portion 26 supporting an ink sheet cartridge 22, a main board 27 and a top plate 28.

The chassis 21 is formed by a bottom surface 21*a*, a first side surface (not shown) along arrow C in FIG. 1 and a second side surface 21*b* along arrow D. Pairs of mounting portions 21*c* for mounting the main board 27 are formed on upper ends of the first side surface (not shown) and the second side surface 21*b* respectively. The mounting portions 21*c* are provided with threaded holes 21*d* meshing with screws 29*a* for fixing the main board 27. The ink sheet cartridge 22 includes a take-up portion 22*b* taking up the ink sheet 22*a*, a supply portion 22*c* supplying the ink sheet 22*a*. The take-up portion 22*b* and the supply portion 22*c* of the ink sheet cartridge 22 have a take-up bobbin 22*d* and a supply bobbin 22*e* respectively. The main board 27 is mounted on the mounting portions 21*c* of the chassis 21 through the top plate 28. More specifically, the main board 27 is fixed by fastening four screws 29*a* passed through four holes 27*a* provided in the main board 27 and four holes 28*a* provided in the top plate 28 to the threaded holes 21*d* of the mounting portions 21*c* of the chassis 21. The base 16 is mounted at a position opposed to the opening 10*g* provided on the housing upper surface 10*a* on the upper surface of the main board 27 with two screws 29*b*. Thus, the four display LEDs 11, the switch portion 14 and the infrared receiving portion 12 are arranged at the position opposed to the opening 10*g*.

Figure 5:
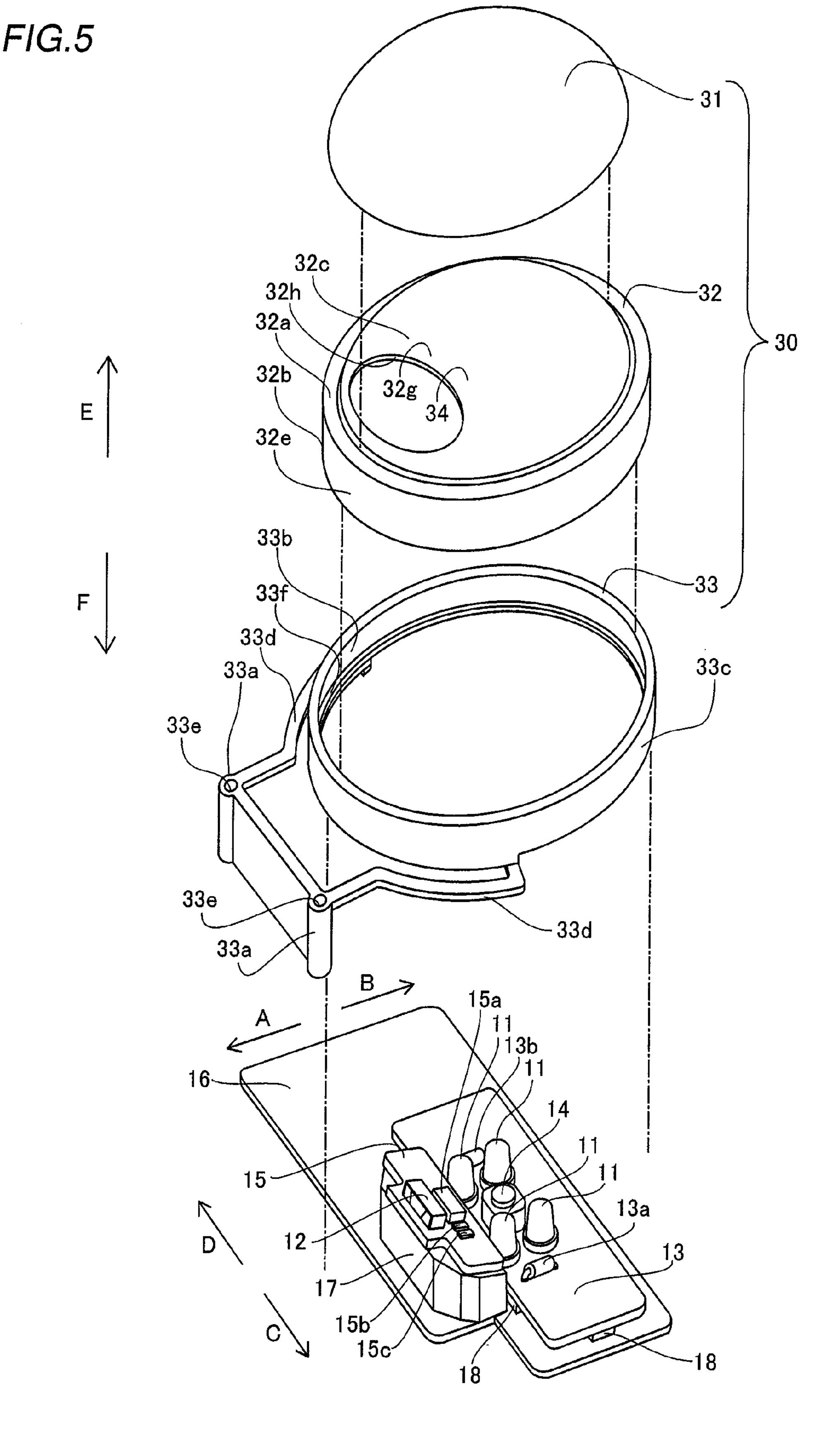
FIG. 5 is an exploded perspective view showing a structure of the vicinity of the power button of the dye sublimation printer according to the embodiment of the present invention shown in FIG. 1.
Figure 6:
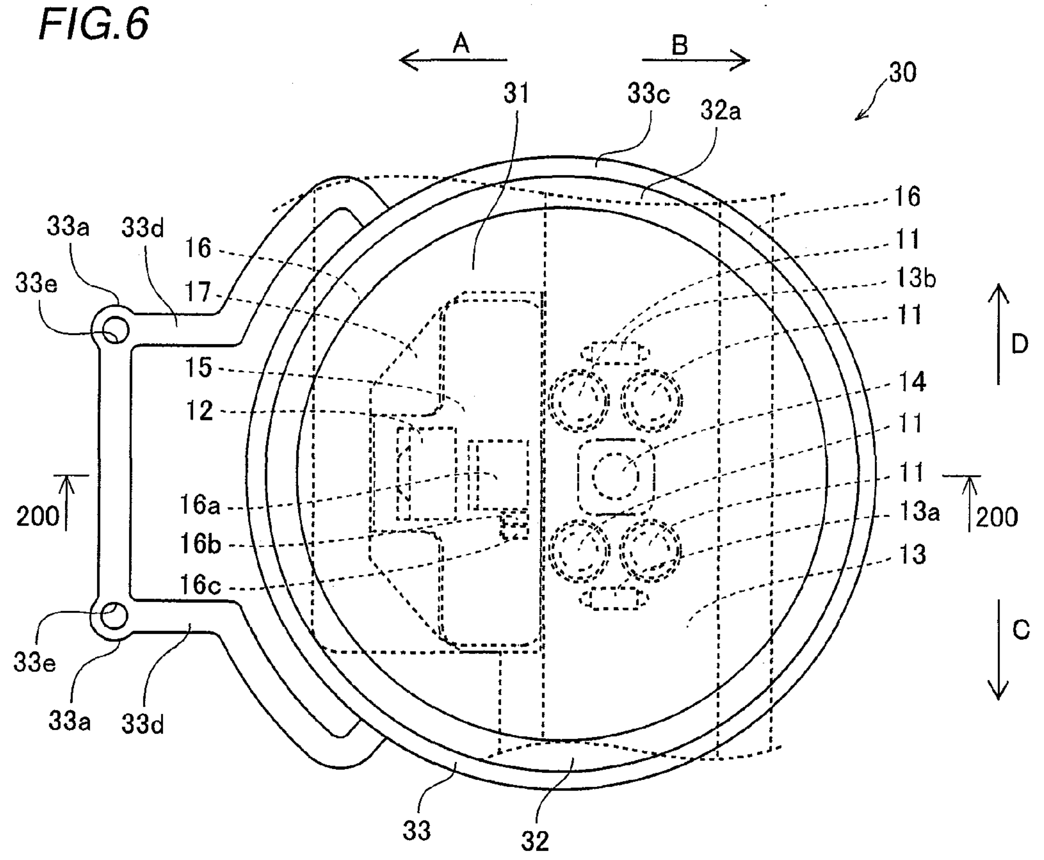
FIG. 6 is a plan view showing the vicinity of the power button of the dye sublimation printer according to the embodiment of the present invention shown in FIG. 1.
Figure 7:
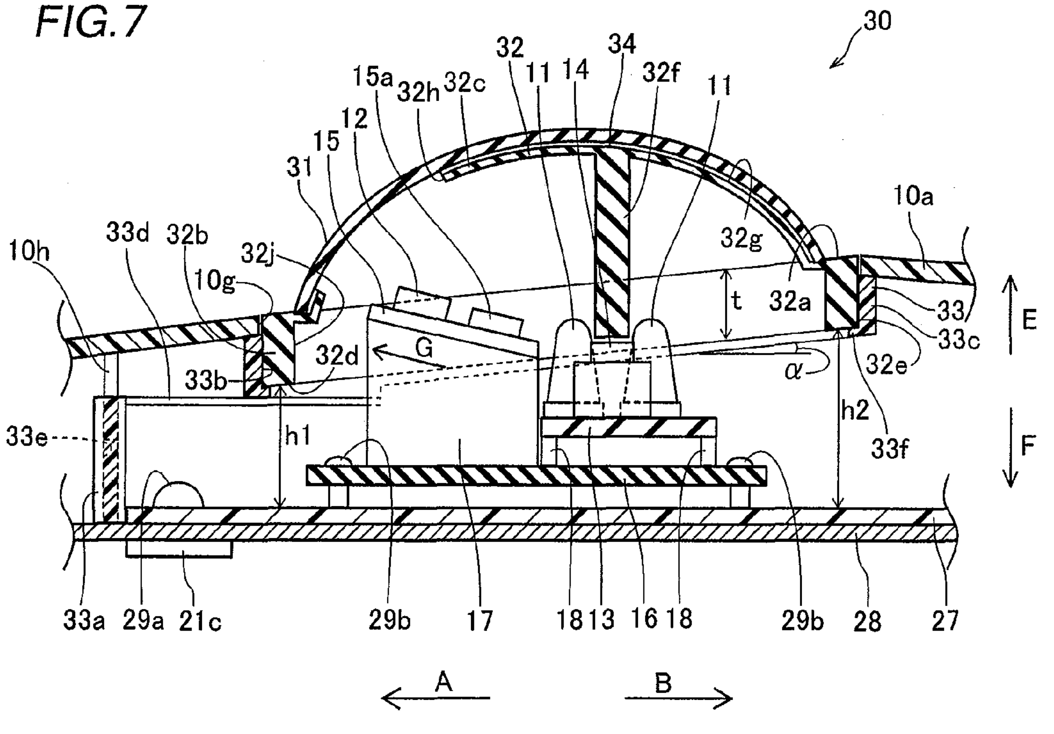
FIG. 7 is a sectional view taken along the line 200-200 in FIG. 6.
Figure 8:
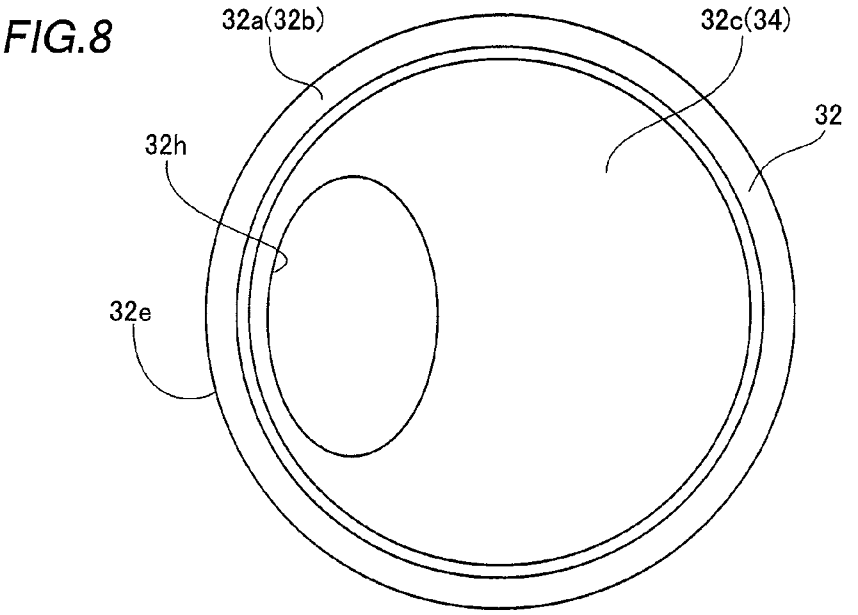
FIG. 8 is a plan view showing a light guide member of the dye sublimation printer according to the embodiment of the present invention shown in FIG. 1.
Figure 9:
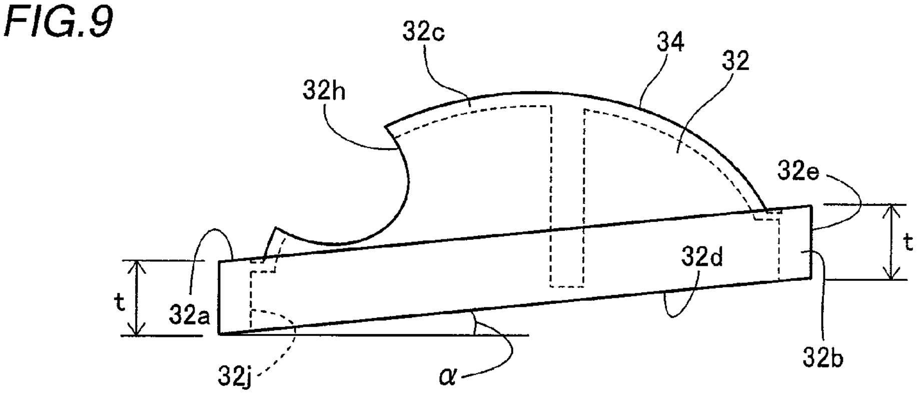
FIG. 9 is a side elevational view showing the light guide member of the dye sublimation printer according to the embodiment of the present invention shown in FIG. 1.

According to this embodiment, the power button 30 is constituted by an infrared filter member 31, a light guide member 32 and a button support portion 33, as shown in FIGS. 4 to 7. As shown in FIGS. 6 and 7, the power button 30 is so mounted on the opening 10*g* of the housing upper surface 10*a* (see FIG. 7) as to cover the display LEDs 11, the switch portion 14 and the infrared receiving portion 12. The button support portion 33 is an example of the "support portion" in the present invention.

The infrared filter member 31 has a dome shape and a filtering function capable of transmitting infrared ray while blocking visible light.

According to this embodiment, the light guide member 32 has a light-emitting surface 32*a* so formed circumferentially as to surround the display LEDs 11 (see FIG. 7) and a circumferential light guide portion 32*b* guiding light to the light-emitting surface 32*a* and a dome portion 32*c* having a light guide function, so provided inside the circumferential light guide portion 32*b* as to be continuous to the light guide portion 32*b* and cover the display LEDs 11, as shown in FIGS. 7 to 10.

According to this embodiment, the circumferential light-emitting surface 32*a* is inclined at an angle of a with respect to the horizontal plane such that the front side (side along arrow A) is lowered along the inclination of the housing upper surface 10*a*, as shown in FIG. 7. The circumferential light guide portion 32*b* is formed such that a first surface (upper surface) constituting a light-emitting surface 32*a* and a second surface constituting a lower surface 32*d* arranged on a side opposite to the first surface are substantially parallel to each other. Thus, a thickness t in the vertical direction (along arrows E and F) of the circumferential light guide portion 32*b* is uniformly formed. In other words, the circumferential light guide portion 32*b* is formed such that the vertical thickness t is substantially uniformly formed with respect to a set surface of the display LEDs 11. In this case, a vertical distance h1 from a portion on the front side (side along arrow A) of the light guide portion 32*b* to the main board 27 horizontally set is shorter than a vertical distance h2 from a portion on the back side (side along arrow B) of the light guide portion 32*b* to the main board 27.

Figure 11:
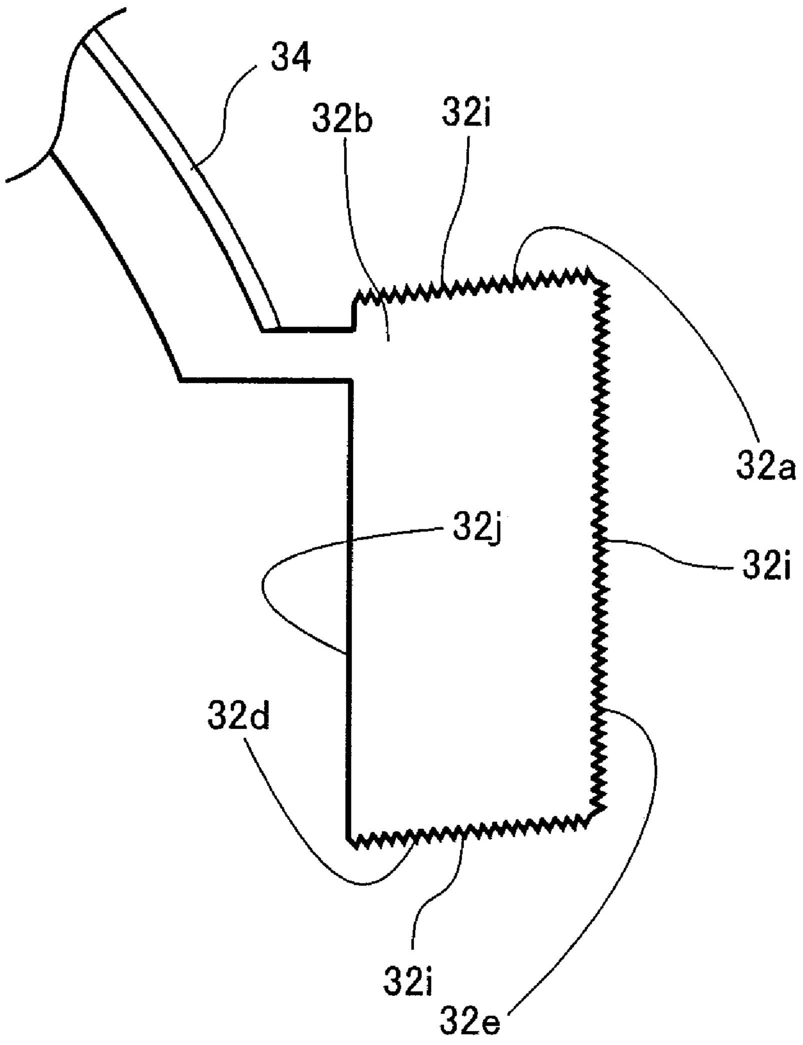
FIG. 11 is an enlarged sectional view showing a finely corrugated portion of the light guide portion of the dye sublimation printer according to the embodiment of the present invention shown in FIG. 1.

According to this embodiment, finely corrugated portions 32*i* diffusing light are formed on the light-emitting surface 32*a*, the lower surface 32*d* and an outer peripheral side surface 32*e* of the light guide portion 32*b*, as shown in FIG. 11. This enables emission of diffused light on the light-emitting surface 32*a*, and hence the light-emitting surface 32*a* can be uniformly brightened. Diffused light inside the light guide portion 32*b* can be reflected on the lower surface 32*d* and the outer peripheral side surface 32*e*, and hence diffused light can be guided to the light-emitting surface 32*a*. Thus, the light-emitting surface 32*a* can be further uniformly brightened. Light can be diffused on the lower surface 32*d* when light incident from the outside of the housing 10 is transmitted through the lower surface 32*d*, the inside of the housing 10 can be inhibited from observableness from the outside of the housing 10 through the light guide portion 32*b*. The inner peripheral side surface 32*j* of the circumferential light guide portion 32*b* has a flat surface shape with no finely corrugated shape diffusing light. The dome portion 32*c* is formed in a dome shape along the dome-shaped infrared filter member 31.

Figure 10:
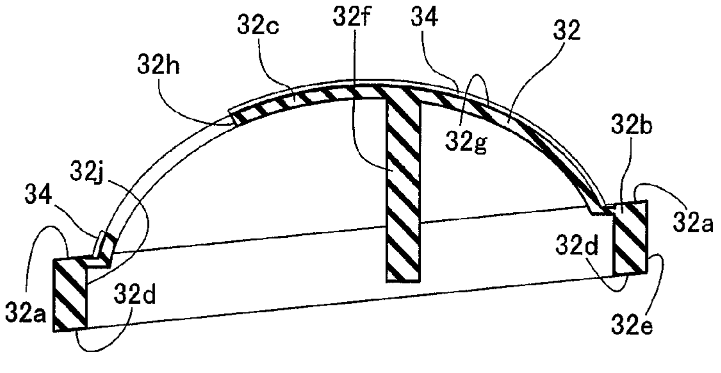
FIG. 10 is a sectional view showing the light guide member of the dye sublimation printer according to the embodiment of the present invention shown in FIG. 1.

According to this embodiment, the dome portion 32*c* is provided with a switch pressing portion 32*f* for pressing the switch portion 14 (see FIG. 7) when pressing the power button 30 (see FIG. 7) at a position opposed to the switch portion 14, as shown in FIGS. 7 and 10. A reflective layer 34 made of a white coating material having a function of reflecting light is formed on an outer surface 32*g* of the dome portion 32*c* for inhibiting light emitted from the display LEDs 11 (see FIG. 7) and incident inside the dome portion 32*c* from emitting from the outer surface 32*g*. The infrared filter member 31 is mounted on the outer surface 32*g* formed with the reflective layer 34 of the dome portion 32*c* with a double-faced adhesive tape (not shown). As shown in FIGS. 7 to 10, an opening 32*h* through which the infrared signal is passed is provided at a position opposed to the infrared receiving portion 12 of the dome portion 32*c*.

Figure 12:
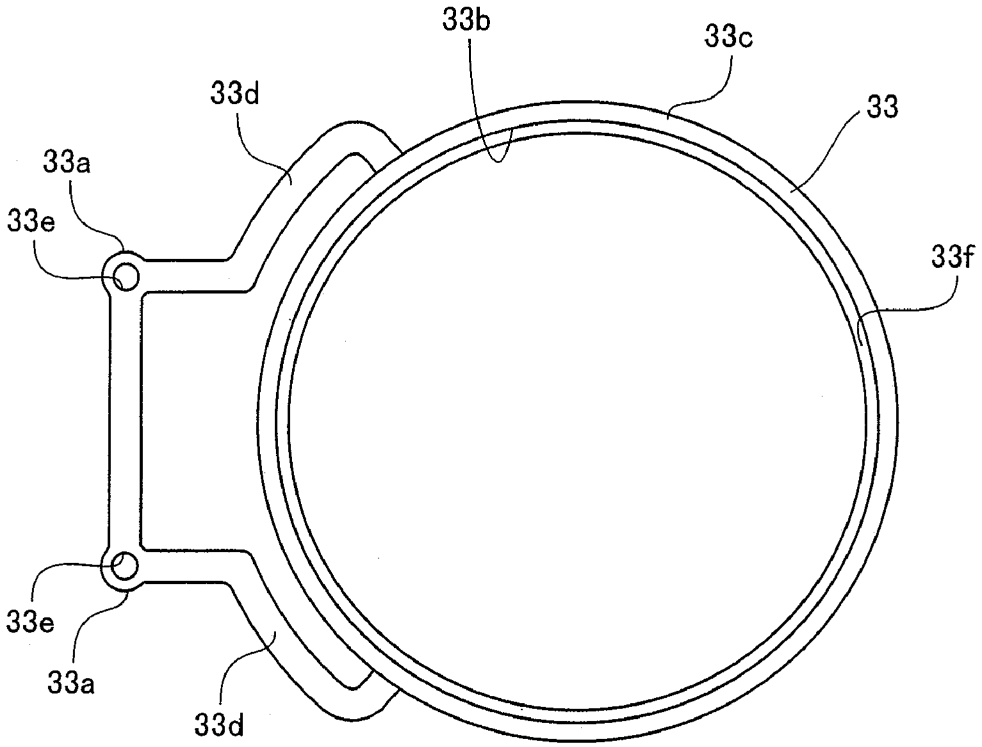
FIG. 12 is a plan view showing a button support portion of the dye sublimation printer according to the embodiment of the present invention shown in FIG. 1.
Figure 13:
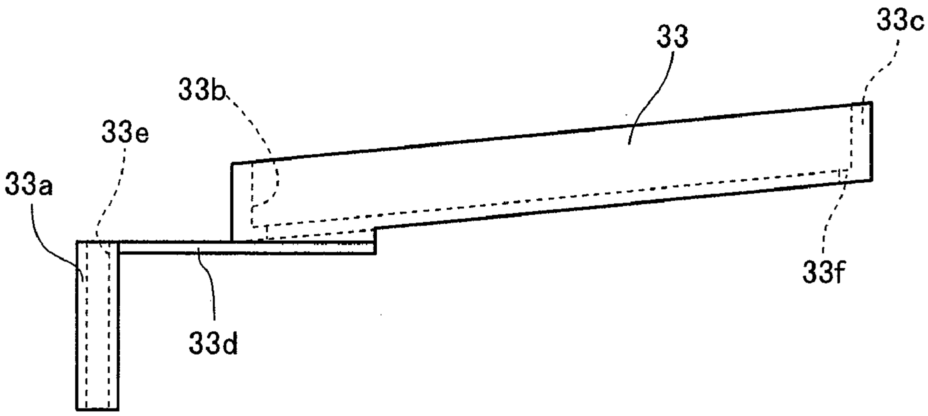
FIG. 13 is a side elevational view showing the button support portion of the dye sublimation printer according to the embodiment of the present invention shown in FIG. 1.
Figure 14:
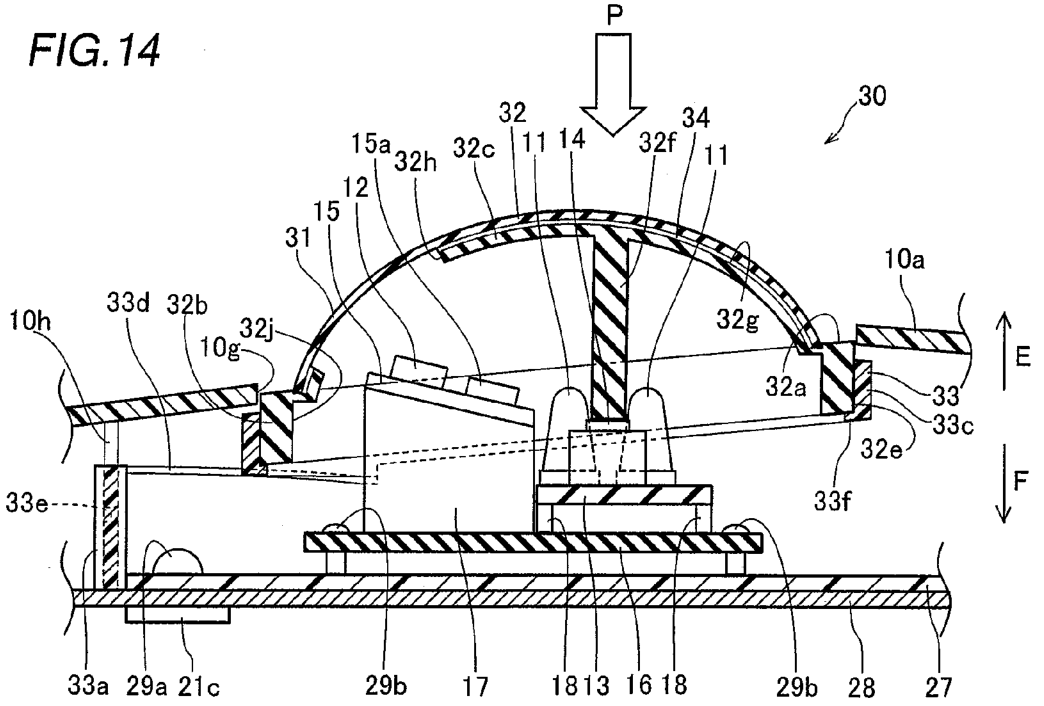
FIG. 14 is a sectional view for illustrating a structure of the power button of the dye sublimation printer according to the embodiment of the present invention shown in FIG. 1.

As shown in FIGS. 7, 12 and 13, the button support portion 33 is constituted by mounting portions 33*a* for mounting the protrusions 10*h* of the housing upper surface 10*a* (see FIG. 7), a ring portion 33*c* formed with an inner peripheral surface 33*b* to be contact with the outer peripheral side surface 32*e* of the light guide portion 32*b* (see FIG. 7) and arm portions 33*d* coupling the mounting portions 33*a* and the ring portion 33*c*. The mounting portions 33*a* has receiving holes 33*e* capable of receiving (being press-fitted around) the protrusions 10*h*. As shown in FIG. 7, the protrusions 10*h* is lightly press-fitted into the receiving holes 33*e* so that the mounting portions 33*a* has an upper portion mounted on the housing upper surface 10*a* and a lower surface in contact with an upper surface of the top plate 28. Thus, the mounting portions 33*a* of the button support portion 33 are fixed. The ring portion 33*c* has a L-shaped receiving portion 33*f* preventing the light guide member 32 from slipping off on a lower portion of the inner peripheral surface 33*b*. As shown in FIG. 5, the power button 30 is assembled by inserting the light guide member 32 mounted with the infrared filter member 31 into the ring portion 33*c* along arrow F. The arm portions 33*d* have first ends fixed on upper ends of the mounting portions 33*a* and second ends fixed on a lower surface of the ring portion 33*c*. In other words, the assembled power button 30 is supported with the fixed arm portions 33*d* extending from the mounting portions 33*a*. More specifically, the power button 30 fixed with the mounting portions 33*a* of the button support portion 33 is movably supported in a pressing direction (along arrow F) by deflecting the arm portions 33*d* relative to the first ends closer to the mounting portions 33*a* of the arm portions 33*d* with pressing force P along arrow F, as shown in FIG. 14. Thus, the arm portions 33*d* are deflected relative to the first ends closer to the mounting portions 33*a* when the power button 30 is pressed along arrow F, and hence the switch pressing portion 32*f* provided on the light guide member 32 moves in the pressing direction to press the switch portion 14. When the pressing force P is released, the switch pressing portion 32*f* moves upward, i.e. in a direction for separating from the switch portion 14 with upward urging force (restoring force) of the deflected arm portions 33*d* and the power button 30 is reset at an original position.

Paths of passage of light emitting from the display LEDs 11 of the dye sublimation printer 1 according to the embodiment of the present invention will be described with reference to FIG. 15.

Figure 15:
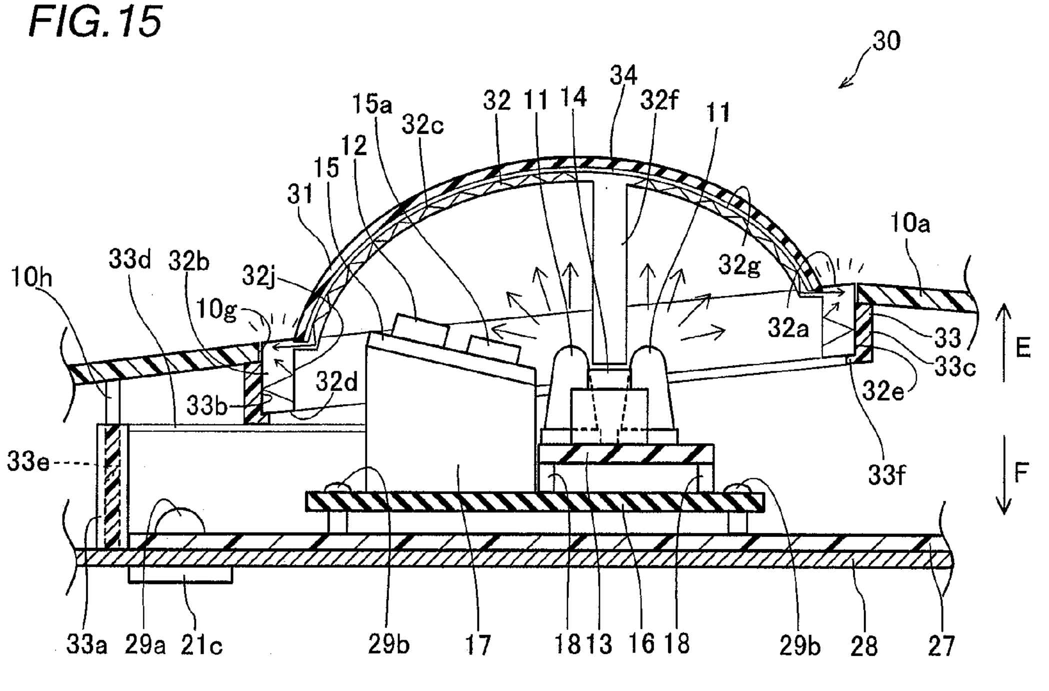
FIG. 15 is a sectional view for illustrating paths of passage of light emitting from the display LEDs of the dye sublimation printer according to the embodiment of the present invention shown in FIG. 1.

As shown in FIG. 15, the light emitting from the display LEDs 11 is applied to an inner surface of the dome portion 32*c* of the light guide member 32 and the inner peripheral side surface of the light guide portion 32*b*. Light applied to the inner surface of the dome portion 32*c* and incident inside the dome portion 32*c* is reflected with the reflective layer 34 of the outer surface 32*g*. The reflected light reaches the light-emitting surface 32*a* through the inside of the dome portion 32*c* while being repeatedly reflected on the inner surface and the outer surface 32*g*. Light applied to the inner peripheral side surface of the light guide portion 32*b* and incident inside of the light guide portion 32*b* reaches the light-emitting surface 32*a* through the inside of light guide portion 32*b* while being repeatedly reflected on the lower surface 32*d*, the outer peripheral side surface 32*e* and the inner peripheral side surface. At this time, the light is diffused to be reflected by the finely corrugated portions 32*i* of the lower surface 32*d* and the outer peripheral side surface 32*e*. Then the light having reached the light-emitting surface 32*a* of the light guide member 32 is emitted from the light-emitting surface 32*a* while being diffused by the finely corrugated portions 32*i* of the light-emitting surface 32*a* and the light-emitting surface 32*a* is brightened.

According to this embodiment, as hereinabove described, the circumferential light-emitting surface 32*a* is so arranged as to be inclined with respect to the board 13 (horizontal plane) where the display LEDs 11 are set, and the circumferential light guide portion 32*b* is formed such that the vertical thickness t is substantially uniform with respect to the board 13 where the display LEDs 11 are set, whereby the light emitted from the display LEDs 11 can be guided to the light-emitting surface 32*a* through the light guide portion 32*b* having the uniform thickness t and hence the light-emitting surface 32*a* can be uniformly brightened also when the circumferential light-emitting surface 32*a* is so arranged as to be inclined with respect to the set surface of the display LEDs 11.

According to this embodiment, the light-emitting surface 32*a* is constituted by the first surface of the circumferential light guide portion 32*b*, and the light guide portion 32*b* is formed such that the first surface constituting the light-emitting surface 32*a* and the second surface constituting the lower surface 32*d* arranged on the side opposite to the first surface are substantially parallel to each other, whereby the circumferential light guide portion 32*b* can be easily formed such that the vertical thickness t is substantially uniform with respect to the board 13 where the display LEDs 11 are set.

According to this embodiment, the light guide member 32 is provided with the dome portion 32*c* having the light guide function, so provided inside the circumferential light guide portion 32*b* as to be continuous to the light guide portion 32*b* and cover the display LEDs 11, whereby the light guide member 32 can guide the light incident upon the dome portion 32*c* from the display LEDs 11 to the light-emitting surface 32*a* and hence the light-emitting surface 32*a* can be further brightened.

According to this embodiment, the reflective layer 34 for reflecting the light from the display LEDs 11 is provided on the outer surface 32*g* of the dome portion 32*c* located between the dome portion 32*c* and the infrared filter member 31 arranged to cover the dome portion 32*c*, whereby the reflective layer 34 can inhibit the light incident upon the dome portion 32*c* from the display LEDs 11 from transmitting through the dome portion 32*c*, and hence a larger amount of the light incident upon the dome portion 32*c* can be guided to the light-emitting surface 32*a*. Thus, the light-emitting surface 32*a* can be further brightened.

According to this embodiment, the inner peripheral side surface 32*j* of the circumferential light guide portion 32*b* of the light guide member 32 upon which the light emitted from the display LEDs 11 is incident is so formed in the flat surface shape with no finely corrugated shape diffusing light, whereby the light having reached the inner peripheral side surface 32*j* of the light guide portion 32*b* from the display LEDs 11 is not diffused and hence as much light as possible can be incident inside the light guide portion 32*b*.

According to this embodiment, the arm portions 33*d* deflected to be moved in the direction in which the switch pressing portion 32*f* of the light guide member 32 presses the switch portion 14 by pressing the light guide member 32 is provided in the button support portion 33, and the switch pressing portion 32*f* is so formed as to be moved in the direction for separating from the switch portion 14 with restoring force of the deflected arm portions 33*d* when the press to the light guide member 32 is released, whereby the switch pressing portion 32*f* can be easily pressed against the switch portion 14 and the switch pressing portion 32*f* can be easily separated from the switch portion 14 when the press is released.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment is applied to the dye sublimation printer employed as an example of the image generating apparatus, the present invention is not restricted to this but is also applicable to an image generating apparatus other than the dye sublimation printer, so far as the image generating apparatus comprises the light-emitting device emitting light for display.

While the finely corrugated portion diffusing light is formed on the lower surface of the light guide portion in order to inhibit the inside of the housing from observableness from the outside of the housing in the aforementioned embodiment, the present invention is not restricted to this but a sheet for inhibiting the inside of the housing from observableness from the outside of the housing may be alternatively mounted.

While the reflective layer made of the white coating material is formed on the outer surface of the dome portion in the aforementioned embodiment, the present invention is not restricted to this but a similar reflective layer may be alternatively formed on the inner surface of the infrared filter member or a sheet reflecting light in place of the reflective layer made of the coating material may be alternatively arranged between the infrared filter member and the dome portion of the light guide member.

While the portable telephone is shown as an apparatus capable of infrared communication in the aforementioned embodiment, the present invention is not restricted to this but an apparatus capable of infrared communication other than the portable telephone may be alternatively employed.

What is claimed is:

1. An image generating apparatus comprising:

a light-emitting device emitting light for display; and a light guide member so arranged as to surround said light-emitting device and including a circumferential light-emitting surface and a circumferential light guide portion guiding the light emitted from said light-emitting device to said light-emitting surface, wherein said circumferential light-emitting surface is constituted by a first surface of said circumferential light guide portion and is so arranged as to be inclined with respect to a device set surface on which said light-emitting device is set, said circumferential light guide portion is formed such that a vertical thickness is substantially uniform with respect to said device set surface and is formed such that said first surface constituting said light-emitting surface and a second surface on a side opposite to said first surface are substantially parallel to each other, and a height of a front part of said second surface from said device set surface in the vertical direction with respect to said device set surface is lower than a height of a rear part of said second surface from said device set surface.

2. The image generating apparatus according to claim 1, wherein at least said light-emitting surface of said light guide member has a finely corrugated shape diffusing light.

3. The image generating apparatus according to claim 2, wherein said light-emitting surface is constituted by a first surface of said circumferential light guide portion, and an outer peripheral side surface of said circumferential light guide portion of said light guide member and a second surface on a side opposite to said first surface constituting said light-emitting surface each have said finely corrugated shape diffusing light.

4. The image generating apparatus according to claim 2, wherein at least an inner peripheral side surface of said circumferential light guide portion of said light guide member upon, which the light emitted from said light-emitting device is incident has a flat surface shape without said finely corrugated shape diffusing light.

5. The image generating apparatus according to claim 1, wherein said light guide member further includes a dome portion having a light guide function, so provided inside said circumferential light guide portion as to be continuous to said light guide portion and cover said light-emitting device.

6. The image generating apparatus according to claim 5, further comprising:

an infrared communication receiving portion provided in the vicinity of said light-emitting device for display;

an infrared filter member so arranged as to cover said dome portion and having a filtering function capable of transmitting infrared ray while blocking visible light; and a reflective layer for reflecting the light from said light-emitting device, provided on a surface of said dome portion or a surface of said infrared filter member located between said dome portion and said infrared filter member.

7. The image generating apparatus according to claim 6, wherein said dome portion of said light guide member has an opening for transmitting said infrared ray at a position opposed to said infrared communication receiving portion.

8. The image generating apparatus according to claim 1, further comprising:

a support portion movably supporting said light guide member in a pressing direction; and a switch portion arranged in the vicinity of said light-emitting device, wherein said light guide member further includes a switch pressing portion arranged at a position opposed to said switch portion.

9. The image generating apparatus according to claim 8, wherein said support portion includes an arm portion so deflected as to be moved in a direction in which said switch pressing portion of said light guide member presses said switch portion by pressing said light guide member, and said switch pressing portion is so formed as to be moved in a direction for separating from said switch portion with restoring force of deflected said arm portion when press to said light guide member is released.

10. An image generating apparatus comprising:

a light-emitting device emitting light for display;

a light guide member so arranged as to surround said light-emitting device and including a circumferential light-emitting surface and a circumferential light guide portion guiding the light emitted from said light-emitting device to said light-emitting surface;

a support portion movably supporting said light guide member in a pressing direction;

a switch portion arranged in the vicinity of said light-emitting device;

an infrared communication receiving portion provided in the vicinity of said light-emitting device for display;

an infrared filter member having a filtering function capable of transmitting infrared ray while blocking visible light; and a reflective layer for reflecting the light from said light-emitting device, wherein said light guide member further includes a dome portion having a light guide function and a switch pressing portion arranged at a position opposed to said switch portion, said circumferential light-emitting surface is so arranged as to be inclined with respect to a surface on which said light-emitting device is set, and constituted by a first surface of said circumferential light guide portion, said circumferential light guide portion is formed such that a vertical thickness is substantially uniform with respect to said surface on which said light-emitting device is set and said first surface constituting said light-emitting surface and a second surface on a side opposite to said first surface are substantially parallel to each other, said dome portion is so provided inside said circumferential light guide portion as to be continuous to said light guide portion and cover said light-emitting device, said infrared filter member is so arranged as to cover said dome portion, and said reflective layer is provided on a surface of said dome portion or a surface of said infrared filter member located between said dome portion and said infrared filter member.

11. The image generating apparatus according to claim 10, wherein at least said light-emitting surface of said light guide member has a finely corrugated shape diffusing light.

12. The image generating apparatus according to claim 11, wherein an outer peripheral side surface of said circumferential light guide portion of said light guide member and a second surface on a side opposite to said first surface constituting said light-emitting surface each have said finely corrugated shape diffusing light.

13. The image generating apparatus according to claim 11, wherein at least an inner peripheral side surface of said circumferential light guide portion of said light guide member, upon which the light emitted from said light-emitting device is incident has a flat surface shape without said finely corrugated shape diffusing light.

14. The image generating apparatus according to claim 10, wherein said dome portion of said light guide member has an opening for transmitting said infrared ray at a position opposed to said infrared communication receiving portion.

15. The image generating apparatus according to claim 10, wherein said support portion includes an arm portion so deflected as to be moved in a direction in which said switch pressing portion of said light guide member presses said switch portion by pressing said light guide member, and said switch pressing portion is so formed as to be moved in a direction for separating from said switch portion with restoring force of deflected said arm portion when press to said light guide member is released.

* * * * *